(12) United States Patent
Chu et al.

(10) Patent No.: US 11,071,229 B1
(45) Date of Patent: Jul. 20, 2021

(54) AIR SHROUD WITH AN AUTOMATICALLY ADJUSTABLE AIR BAFFLE FOR AN INFORMATION HANDLING SYSTEM

(71) Applicant: DELL PRODUCTS, LP, Round Rock, TX (US)

(72) Inventors: White Yi-Pai Chu, Taoyuan (TW); Eric Shih Huai Cho, Linkou District (TW)

(73) Assignee: Dell Products L.P., Round Rock, TX (US)

( * ) Notice: Subject to any disclaimer, the term of this patent is extended or adjusted under 35 U.S.C. 154(b) by 0 days.

(21) Appl. No.: 16/832,409

(22) Filed: Mar. 27, 2020

(51) Int. Cl.
*H05K 7/20* (2006.01)
*G06F 1/20* (2006.01)

(52) U.S. Cl.
CPC .......... *H05K 7/20145* (2013.01); *G06F 1/20* (2013.01); *H05K 7/20172* (2013.01); *H05K 7/20727* (2013.01)

(58) Field of Classification Search
CPC .......... H05K 7/20145; H05K 7/20154; H05K 7/20509; H05K 7/20727; H05K 1/0203; G06F 1/20
See application file for complete search history.

(56) References Cited

U.S. PATENT DOCUMENTS

| | | | | |
|---|---|---|---|---|
| 6,951,446 | B2* | 10/2005 | Hung | F04D 25/166 361/695 |
| 7,256,993 | B2 | 8/2007 | Cravens et al. | |
| 7,397,660 | B2* | 7/2008 | Strmiska | G06F 1/20 361/679.48 |
| 8,395,892 | B2* | 3/2013 | Li | H05K 7/20727 361/679.49 |
| 9,497,891 | B2 | 11/2016 | Alvarado et al. | |
| 2008/0117589 | A1* | 5/2008 | Carrera | G06F 1/20 361/679.51 |
| 2010/0122792 | A1 | 5/2010 | Shabbir et al. | |
| 2013/0286584 | A1* | 10/2013 | Lin | H05K 7/20181 361/695 |

* cited by examiner

*Primary Examiner* — Zachary Pape
(74) *Attorney, Agent, or Firm* — Larson Newman, LLP

(57) ABSTRACT

An air shroud includes a main portion, an extension portion, and a first adjustable air baffle. The main portion is in physical communication with one or more cooling fans of an information handling system. The extension portion extends from the main portion. The first adjustable air baffle is in physical communication with the extension portion. The first adjustable air baffle is biased toward an extended position. When a first memory module is located within a first memory slot of an information handling system while the main portion is in physical communication with the one or more cooling fans, the first adjustable air baffle transitions from the extended position to a collapsed position in response to a force being exerted on the first adjustable air baffle by the first memory module.

18 Claims, 4 Drawing Sheets

AIR SHROUD WITH AN AUTOMATICALLY ADJUSTABLE AIR BAFFLE FOR AN INFORMATION HANDLING SYSTEM

FIELD OF THE DISCLOSURE

This disclosure generally relates to information handling systems, and more particularly relates to an air shroud with an automatically adjustable air baffle to guide air flow within an information handling system.

BACKGROUND

As the value and use of information continues to increase, individuals and businesses seek additional ways to process and store information. One option is an information handling system. An information handling system generally processes, compiles, stores, and/or communicates information or data for business, personal, or other purposes. Because technology and information handling needs and requirements can vary between different applications, information handling systems can also vary regarding what information is handled, how the information is handled, how much information is processed, stored, or communicated, and how quickly and efficiently the information can be processed, stored, or communicated. The variations in information handling systems allow for information handling systems to be general or configured for a specific user or specific use such as financial transaction processing, airline reservations, enterprise data storage, or global communications. In addition, information handling systems can include a variety of hardware and software components that can be configured to process, store, and communicate information and can include one or more computer systems, data storage systems, and networking systems.

SUMMARY

An air shroud includes a main portion in physical communication with one or more cooling fans of an information handling system. A first adjustable air baffle is in physical communication with an extension portion. The first adjustable air baffle is biased toward an extended position. When a first memory module is located within a first memory slot of an information handling system while the main portion is in physical communication with the one or more cooling fans, the first adjustable air baffle transitions from the extended position to a collapsed position in response to a force being exerted on the first adjustable air baffle by the first memory module.

BRIEF DESCRIPTION OF THE DRAWINGS

It will be appreciated that for simplicity and clarity of illustration, elements illustrated in the Figures have not necessarily been drawn to scale. For example, the dimensions of some of the elements are exaggerated relative to other elements. Embodiments incorporating teachings of the present disclosure are shown and described with respect to the drawings presented herein, in which.

The use of the same reference symbols in different drawings indicates similar or identical items.

DETAILED DESCRIPTION OF DRAWINGS

The following description in combination with the Figures is provided to assist in understanding the teachings disclosed herein. The following discussion will focus on specific implementations and embodiments of the teachings. This focus is provided to assist in describing the teachings and should not be interpreted as a limitation on the scope or applicability of the teachings. However, other teachings can certainly be utilized in this application.

Figure 1:
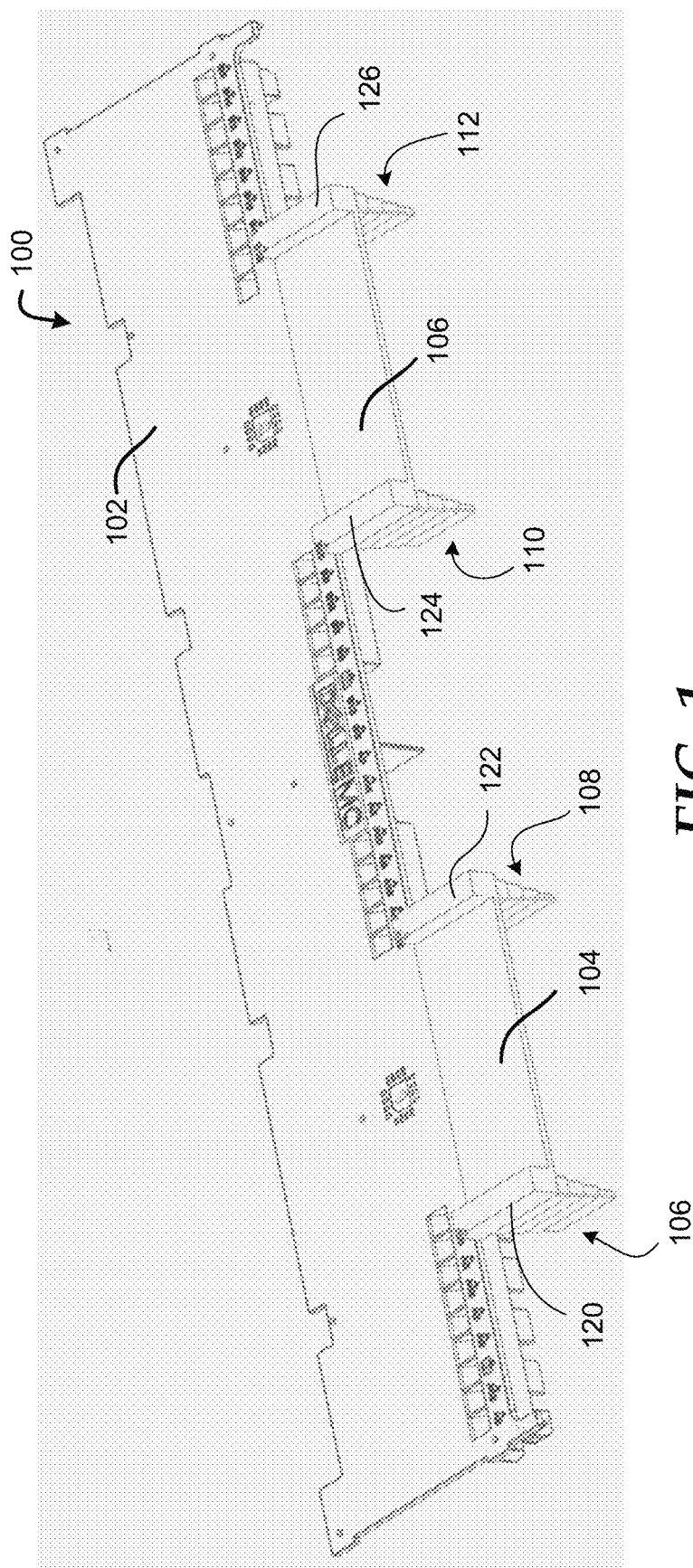
FIG. 1 illustrates an air shroud including multiple adjustable air baffles in accordance with at least one embodiment of the present disclosure.

FIG. 1 shows an air shroud 100 for an information handling system in accordance with at least one embodiment of the present disclosure. For purposes of this disclosure, the information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, an information handling system may be a personal computer, a PDA, a consumer electronic device, a network server or storage device, a switch router or other network communication device, or any other suitable device and may vary in size, shape, performance, functionality, and price. The information handling system may include memory, one or more processing resources such as a central processing unit (CPU) or hardware or software control logic. Additional components of the information handling system may include one or more storage devices, one or more communications ports for communicating with external devices as well as various input and output (I/O) devices, such as a keyboard, a mouse, and a video display. The information handling system may also include one or more buses operable to transmit communications between the various hardware components.

The air shroud 100 includes a main portion 102, extension portions 104 and 106, and air baffles 106, 108, 110, and 112. Extension portion 104 includes enclosures 120 and 122, and extension portion 106 includes enclosures 124 and 126. In an example, extension portions 104 and 106 may extend from main portion 102 in a parallel plane as a top surface of the main portion. In an embodiment, enclosures 120 and 122 are located on opposite sides of extension portion 104, and enclosures 124 and 126 are located on opposite sides of extension portion 106. In an example, one end of enclosure 120 is in physical communication with main portion 102 and extends from the main portion to a distal end of extension portion 104. Similarly, one end of enclosure 122 is in physical communication with main portion 102 and extends from the main portion to a distal end of extension portion 104. Additionally, one end of enclosure 124 is in physical communication with main portion 102 and extends from the main portion to a distal end of extension portion 106. One end of enclosure 126 is in physical communication with main portion 102 and extends from the main portion to a distal end of extension portion 106.

In an example, air baffle 106 extends from enclosure 120 of extension portion 104, and air baffle 108 extends from enclosure 122 of extension portion 104. Similarly, air baffle 110 extends from enclosure 124 of extension portion 106, and air baffle 112 extends from enclosure 126 of extension portion 106. In certain examples, air baffle 106 may be biased toward an extended position, such that the air baffle remains in the extended position from enclosure 120 of extension portion 104 unless an external force is exerted on the air baffle. Air baffle 108 may be biased toward an extended position, such that the air baffle remains in the extended position from enclosure 122 of extension portion 104 unless an external force is exerted on the air baffle. Similarly, air baffle 110 may be biased toward an extended position, such that the air baffle remains in the extended position from enclosure 124 of extension portion 106 unless an external force is exerted on the air baffle. Air baffle 112 may be biased toward an extended position, such that the air baffle remains in the extended position from enclosure 126 of extension portion 106 unless an external force is exerted on the air baffle. In an example, an external force may be any force exerted to an outside surface of the air baffle, such as a force exerted on the outside of the air baffle.

Figure 2:
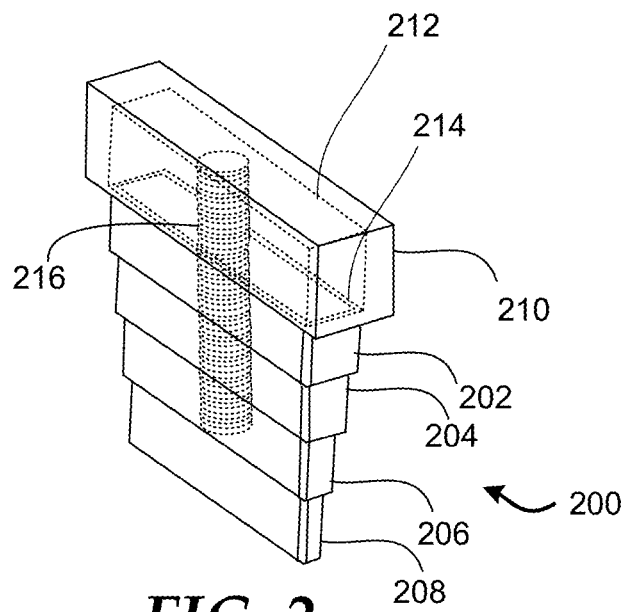
FIG. 2 illustrates an adjustable air baffle in an extended position in accordance with at least one embodiment of the present disclosure.

FIG. 2 shows an adjustable air baffle 200 in an extend position in accordance with at least one embodiment of the present disclosure. Adjustable air baffle 200 includes any suitable number of sections, such as a first section 202, a second section 204, a third section 206, and a fourth section 208. Air baffle 200 may be any suitable air baffle including, but not limited to, air baffles 106, 108, 110, and 112 of FIG. 1. In an example, air baffle 200 may extend from an enclosure 210. In certain examples, enclosure 210 may be any suitable enclosure of an extension portion, such as enclosures 120, 122, 124, and 126 of FIG. 1. Enclosure 210 may include a cavity 212, which in turn may include a relief portion 214 around an opening of the cavity. A spring 216 is disposed between a top surface of cavity 212 and a lower section of air baffle, such as section 208. In an example, spring 216 may exert a force on both the top surface of cavity 212 and the lower section of air baffle 200 to bias the air baffle toward the extended position.

In an example, top section 202 of air baffle 200 may include a ledge that may be placed in physical communication with relief portion 214 of cavity 212 while the air baffle is in the extended position. In this situation, the ledge of top section 202 may prevent air baffle 200 from being completely pushed out of cavity 212 via spring 216. In certain examples, sections 202, 204, and 206 of air baffle 200 may include both a relief portion and a ledge and section 208 may include only a ledge, such that the ledge of a lower section may be placed in physical communication with the relief portion of the next higher section when the air baffle is in the extended position. In an example, the interface or physical communication of the ledges and relief portions of the different sections of air baffle 202 may control the length of the air baffle while in the extended position as caused by spring 216. However, when a suitable external force is placed on the lowest section, such as section 208, of air baffle 200, the air baffle may transition from the extended position to a collapsed position as shown in FIG. 3.

Figure 3:
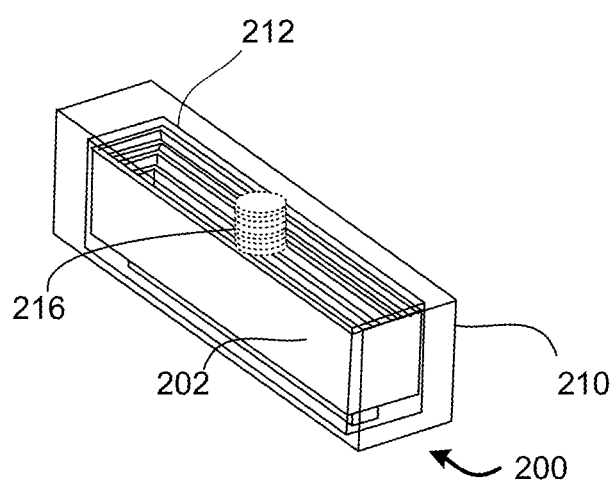
FIG. 3 illustrates an adjustable air baffle in a collapsed position in accordance with at least one embodiment of the present disclosure.

FIG. 3 shows adjustable air baffle 200 in a collapsed position in accordance with at least one embodiment of the present disclosure. In an example, the external force may be exerted in a particular direction so that each section of air baffle 200 is pushed within the next higher section and the highest section, such as section 202, is pushed within cavity 212 of enclosure 210. In an embodiment, the external force may cause the lowest section, such as section 208, to compress spring 216 in between the top surface of cavity 212 of enclosure 210 and the bottom section of air baffle 200. While air baffle 200 is in the collapsed position, every section of the air baffle may be located within cavity 212 of enclosure 210, such that another component may be placed in physical communication with both a bottom surface of the enclosure and the bottom surface of the air baffle.

Figure 4:
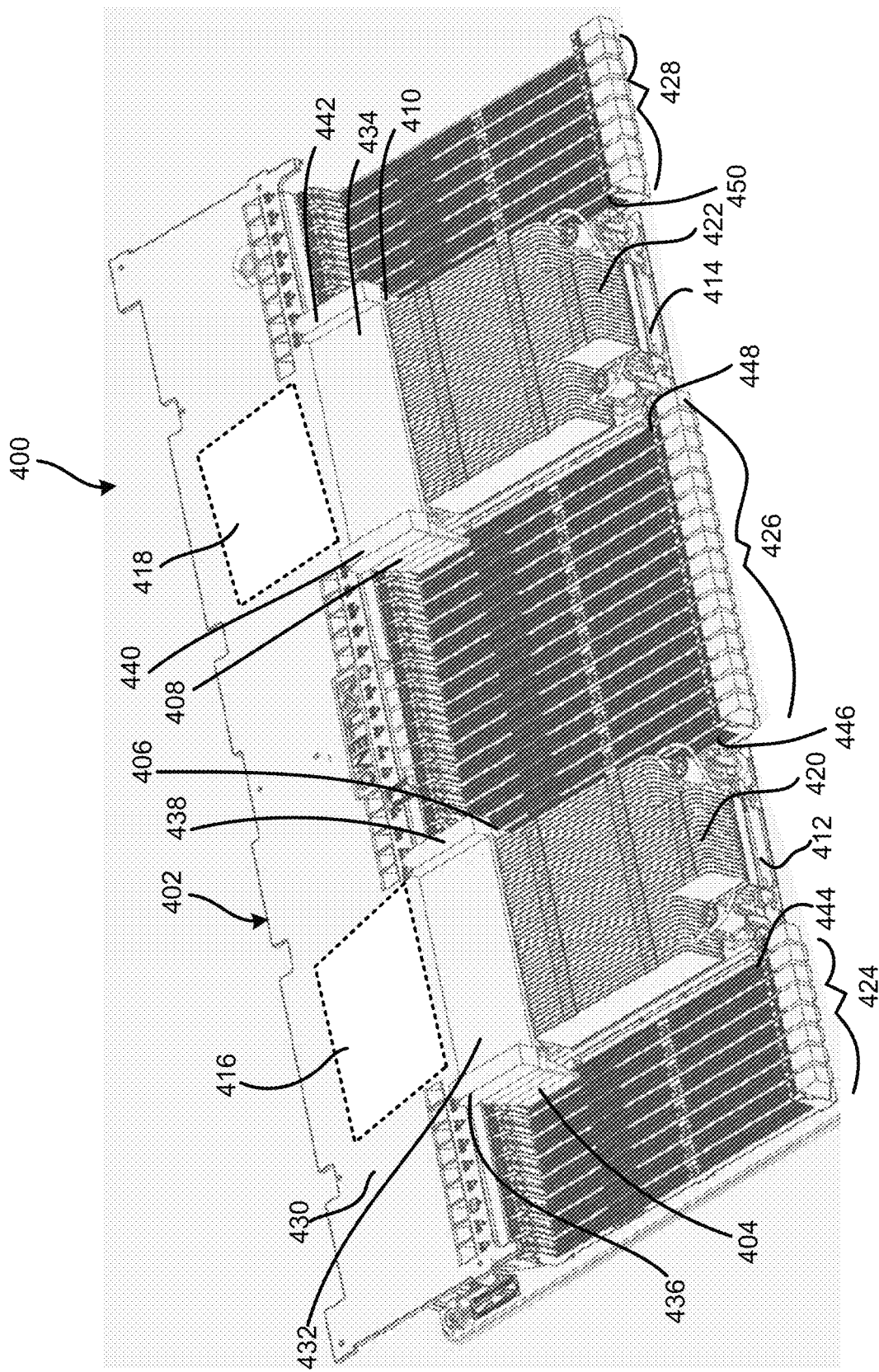
FIG. 4 illustrates a portion of an information handling system having an air shroud with adjustable air baffles in extended positions in accordance with at least one embodiment of the present disclosure.

FIG. 4 illustrates a portion of an information handling system 400 having an air shroud 402 with multiple adjustable air baffles 404, 406, 408, and 410 in extended positions in accordance with at least one embodiment of the present disclosure. Information handling system 400 also includes processors 412 and 414, cooling fans 416 and 418, heat sinks 420 and 422, and sets of memory module slots 424, 426, and 428. Air shroud 402 includes a main portion 430, extension portions 432 and 434, and air baffles 404, 406, 408, and 410. Extension portion 432 includes enclosures 436 and 438, and extension portion 434 includes enclosures 440 and 442. In an example, extension portions 432 and 434 may extend from main portion 430 in a parallel plane as a top surface of the main portion. In an embodiment, enclosures 436 and 438 are located on opposite sides of extension portion 432, and enclosures 440 and 442 are located on opposite sides of extension portion 434. In an example, air shroud 402 may be any suitable air shroud including, but not limited to, air shroud 102 of FIG. 1. Air baffles 404, 406, 408, and 410 may be any suitable air baffle including, but not limited to, air baffles 106, 108, 110, and 112 of FIG. 1, and air baffle 200 of FIGS. 2 and 3.

In an example, cooling fan 416 may provide cooling air flow across heat sink 420 to increase heat reduction of processor 412. Similarly, cooling fan 418 may provide cooling air flow across heat sink 422 to increase heat reduction of processor 414. In certain examples, the air flow from cooling fan 416 may be directed toward heat sink 420 via an opening in a cooling unit that includes the cooling fan. Similarly, the air flow from cooling fan 418 may be directed toward heat sink 422 via an opening in a cooling unit that includes the cooling fan. However, information handling system 400 may include a gap on either or both sides of heat sink 420 and a gap on either or both sides of heat sink 422. In this situation, if no memory modules are located in the set of memory module slots 424, 426, and 428, air flow may spread into open areas of information handling system 400 via the gaps on the sides of heat sinks 420 and 422, such that the amount of air flow over the heat sinks will be reduced and the cooling.

In an example, the gaps between the cooling unit and each of heat sinks 420 and 422 may result from any suitable features within information handling system 400. For example, each of heat sinks 420 and 422 may include one or more locations where the heat sinks are mounted on information handling system 400. In this example, the locations of air gaps may include any suitable mounting component including, but not limited to, a peek nut and/or a clip wire. Thus, the gaps between the cooling unit and each of heat sinks 420 and 422 may cause significant airflow leakage when a closest memory module slot is not populated, and such an airflow leakage may induce overheating or shutdown of processor 412 and 414.

Previous information handling systems had components to block the air flow through the gaps by heat sinks 420 and 422. These previously utilized components may be any suitable component including memory module blanks. In these previous information handling systems, a memory module blank may be placed in memory module slots closest to processor 412 and heat sink 420, such as memory module slots 444 and 446, and in memory module slots closest to processor 414 and heat sink 422, such as memory module slots 448 and 450. However, memory module blanks only work to mitigate the bypassing of airflow around heat sinks 420 and 422 if a user installs the memory module blanks in the proper slots when memory modules are removed from the information handling system. Thus, air shroud 402 with the automatically adjustable air baffles 404, 406, 408, and 410 may be utilized to improve information handling system 400 by preventing airflow from cooling fan 416 from bypassing heat sink 420 and processor 412 and preventing airflow from cooling fan 418 from bypassing heat sink 422 and processor 414.

During installation of memory modules within information handling system 400, the memory modules are first inserted into memory module slots in the slots furthest from processor 412 and 414 and then memory modules are inserted in memory module slots towards the processors. Thus, memory module slots 444, 446, 448, and 450 may be the last memory module slot to receive a memory module. In this situation, one or more memory modules may be inserted within one or more slots of memory module slots 424, 426, and 428, but the memory module slots nearest heat sinks 420 and 422 and processors 412 and 414 may remain empty.

Air shroud 402 with automatically adjustable air baffles 404, 406, 408, and 410 may be utilized to prevent air flow from leaking around heat sinks 420 and 422 while memory modules are not located within memory module slots 444, 446, 448, and 450. In an example, air shroud 402 may be placed in physical communication with cooling fans 416 and 418 in any suitable manner including, but not limited to, being securely attached to the cooling unit including the cooling fans. In certain examples, air shroud 402 may be securely attached to the cooling unit via any suitable manner including, but not limited to, the air shroud snap fitting on top of the cooling unit, and screws or bolts to attach the air shroud to the cooling unit.

Upon air shroud 402 being placed in physical communication with cooling fans 416 and 418 of the cooling unit, extension portion 432 may cover a top gap between the cooling unit and heat sink 420, and air baffles 404 and 406 may close the gaps on either side of the heat sink. In an example, based on air baffles 404 and 406 being biased toward the extended position, the air baffles may automatically close the gaps on the sides of the heat sink. For example, air baffle 404 may extend down from enclosure 436 of extended portion 432 and a lower section of the air baffle may be placed in physical communication with memory module slot 444 nearest to and on a first side of heat sink 420 and processor 412. Similarly, air baffle 406 may extend down from enclosure 438 of extended portion 432 and a lower section of the air baffle may be placed in physical communication with memory module slot 446 nearest to and on a second side of heat sink 420 and processor 412. In an example, a spring, such as spring 216 of FIG. 2, may be disposed between a top surface of a cavity within each of enclosures 436 and 438 and a lower section of respective air baffles 404 and 406 to bias the air baffles toward the extended position. For example, a first spring may be disposed between enclosure 436 and a lower section of air baffle 404, a second spring may be disposed between enclosure 438 and a lower section of air baffle 406.

Additionally, upon air shroud 402 being placed in physical communication with cooling fans 416 and 418 of the cooling unit, extension portion 434 may cover a top gap between the cooling unit and heat sink 422, and air baffles 408 and 410 may close the gaps on either side of the heat sink. In an example, based on air baffles 408 and 410 being biased toward the extended position, the air baffles may automatically close the gaps on the sides of the heat sink. For example, air baffle 408 may extend down from enclosure 440 of extended portion 434 and a lower section of the air baffle may be placed in physical communication with memory module slot 448 nearest to and on a first side of heat sink 422 and processor 414. Similarly, air baffle 410 may extend down from enclosure 442 of extended portion 434 and a lower section of the air baffle may be placed in physical communication with memory module slot 450 nearest to and on a second side of heat sink 422 and processor 414. In an example, a spring, such as spring 216 of FIG. 2, may be disposed between a top surface of a cavity within each of enclosures 440 and 442 and a lower section of respective air baffles 408 and 410 to bias the air baffles toward the extended position. For example, a third spring may be disposed between enclosure 440 and a lower section of air baffle 408, a fourth spring may be disposed between enclosure 442 and a lower section of air baffle 410.

In an example, the biasing of air baffles 404, 406, 408, and 410 toward the extended position enables air shroud 402 to prevent air flow from cooling fans 416 and 418 from bypassing heat sinks 420 and 422 and processor 412 and 414. Thus, air shroud 402 may improve information handling system 400 by directing the air flow from cooling fans 416 and 418 to improve the cooling of processors 412 and 414 while no memory modules are found in memory slots 444, 446, 448, and 450 adjacent to the processors.

Figure 5:
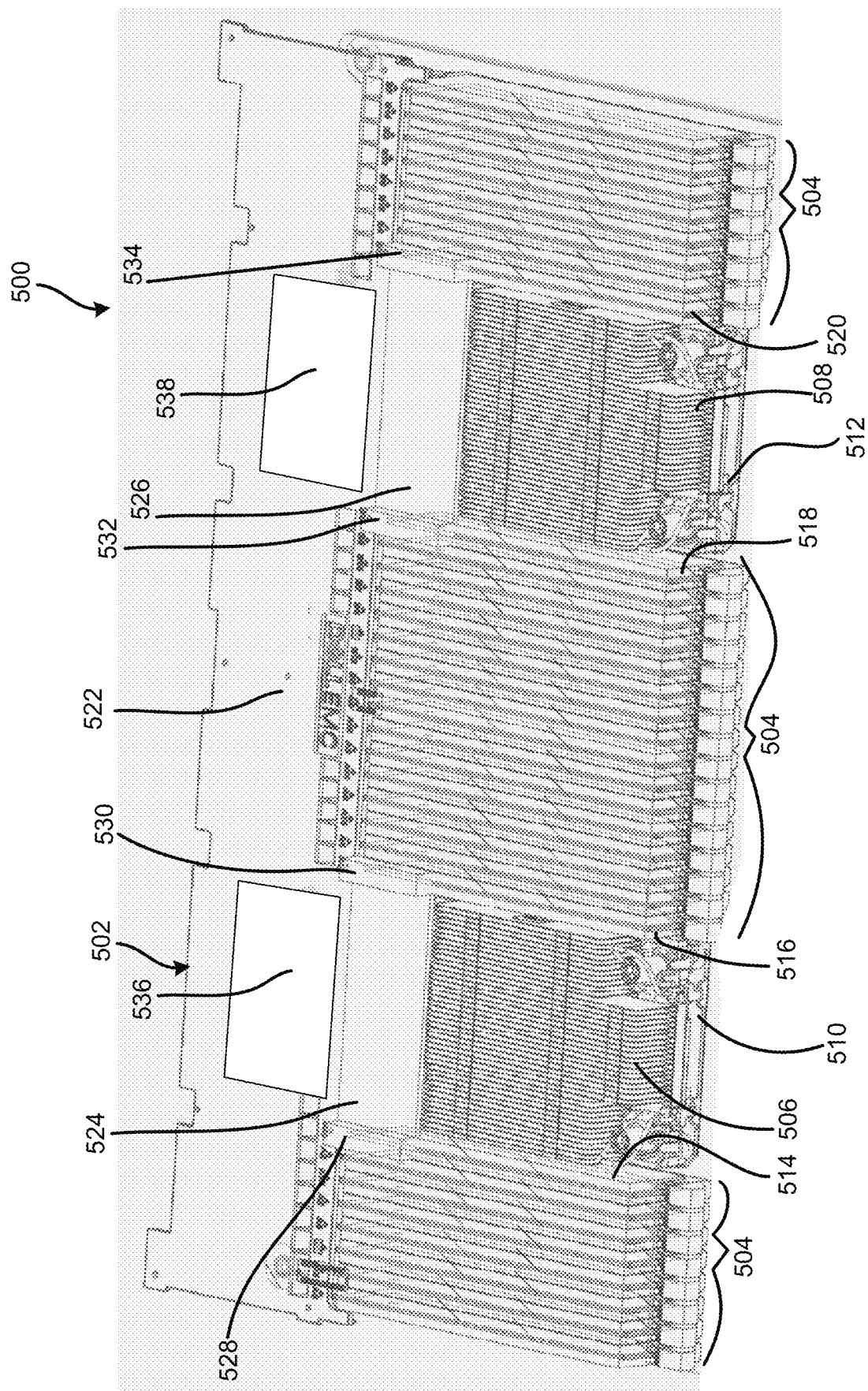
FIG. 5 illustrates a portion of an information handling system having an air shroud with adjustable air baffles in collapsed positions in accordance with at least one embodiment of the present disclosure.

FIG. 5 illustrates a portion of an information handling system 500 having an air shroud 502 in accordance with at least one embodiment of the present disclosure. Information handling system 500 further includes multiple memory modules 504, heat sinks 506 and 508, and processors 510 and 512. In an example, multiple memory modules 504 include one or more memory modules located in memory module slots adjacent to heat sinks 506 and 508 and processors 510 and 512. For example, memory modules 514 and 516 are located in memory module slots adjacent to heat sink 506 and processor 510, and memory modules 518 and 520 are located in memory module slots adjacent to heat sink 508 and processor 512. Air shroud 502 includes a main portion 522, extension portions 524 and 526. Extension portion 524 includes enclosures 528 and 530, and extension portion 526 includes enclosures 532 and 534. In an example, information handling system 500 and air shroud 502 may include additional components not shown in FIG. 5 without varying from the scope of the disclosure. Information handling system 500 may be any suitable information handling system including information handling system 400 of FIG. 4. Air shroud 502 may be any suitable air shroud including air shroud 100 of FIG. 1, and air shroud 402 of FIG. 4.

In response to air shroud 502 being placed in physical communication with cooling fans 536 and 538 in a cooling unit of information handling system 500, air baffles of the air shroud may be placed in physical communication with memory modules 514, 516, 518, and 520. In an example, the air baffles of air shroud 502 may be any suitable automatically adjustable air baffles including, but not limited to, air baffles 404, 406, 408, and 410 of FIG. 4, and air baffle 200 of FIGS. 2 and 3. As a bottom section of the air baffles of air shroud 502 are placed in physical communication with memory modules 514, 516, 518, and 520, the memory modules may exert an external force on the air baffles such that the air baffles may automatically transition from an extended position to a collapsed position as discussed with respect to FIGS. 2 and 3 above.

In an example, as the external forces from memory modules 514, 516, 518, and 520 are exerted on the air baffles, each of the air baffles may collapse within a corresponding enclosure of enclosures 528, 530, 532, and 534. In this example, the air baffles of air shroud 502 may automatically transition from the extended position to the collapsed position so that the air shroud may be securely mounted on the cooling fans of the cooling unit without interference from the air baffles. In certain examples, if memory modules 514, 516, 518, and 520 are removed from information handling system 500, the air baffles of air shroud 502 may automatically transition from the collapsed position to the extended position to prevent air flow leakage as described with respect to FIG. 4 above.

Although only a few exemplary embodiments have been described in detail in the exemplary embodiments without materially departing from the novel teachings and advantages of the embodiments of the present disclosure. For example, the methods described in the present disclosure can be stored as instructions in a computer readable medium to cause a processor to perform the method. Additionally, the methods described in the present disclosure can be stored as instructions in a non-transitory computer readable medium, such as a hard disk drive, a solid state drive, a flash memory, and the like. Accordingly, all such modifications are intended to be included within the scope of the embodiments of the present disclosure as defined in the following claims. In the claims, means-plus-function clauses are intended to cover the structures described herein as performing the recited function and not only structural equivalents, but also equivalent structures.

What is claimed is:

1. An air shroud comprising:
   a main portion to be placed in physical communication over one or more cooling fans of an information handling system;
   an extension portion extending from the main portion;
   a first spring in physical communication with the extension portion; and
   a first adjustable air baffle in physical communication with the extension portion, the first adjustable air baffle having a plurality of sections including a top section and a bottom section, the first spring extends from the bottom section to the extension portion through an inside of the top section, the first adjustable air baffle biased toward an extended position by the first spring, the first adjustable air baffle to transition from the extended position to a collapsed position in response to a force exerted on the first adjustable air baffle by a first memory module of the information handling system when the first memory module is located within a first memory slot of the information handling system while the main portion is in physical communication with the one or more cooling fans, wherein the first memory slot is adjacent to and on a first side of a processor of the information handling system.

2. The air shroud of claim 1 further comprising:
   a second adjustable air baffle in physical communication with the extension portion, the second adjustable air baffle is biased toward an extended position, the second adjustable air baffle to transition from the extended position to a collapsed position in response to a force exerted on the second adjustable air baffle by a second memory module of the information handling system when the second memory module is located within a second memory slot of the information handling system while the main portion is in physical communication with the one or more cooling fans, wherein the second memory slot is adjacent to and on a second side of the processor.

3. The air shroud of claim 2 when the second adjustable air baffle is in the extended position and the main portion is in physical communication with the one or more cooling fans, the second adjustable air baffle prevents air flow from the one or more cooling fans from bypassing the processor on the second side of the processor.

4. The air shroud of claim 2 further comprising a second spring in physical communication with the second adjustable air baffle and the extension portion, the second spring disposed between the second adjustable air baffle and the extension portion to bias the second adjustable air baffle toward the extended position.

5. The air shroud of claim 1 wherein when the first adjustable air baffle is in the extended position and the main portion is in physical communication with the one or more cooling fans, the first adjustable air baffle prevents air flow from the one or more cooling fans from bypassing the processor on the first side of the processor.

6. The air shroud of claim 1 wherein the first adjustable air baffle extends from an enclosure of the extension portion.

7. The air shroud of claim 1 wherein the extension portion extends parallel to the main portion.

8. An information handling system comprising:
   a processor;
   a first plurality of memory slots on a first side of the processor, the first plurality of memory slots including a first memory slot adjacent to and on the first side of the processor; and
   an air shroud in physical communication with one or more cooling fans of the information handling system, the air shroud including:
      a main portion in physical communication with the one or more cooling fans of the information handling system;
      an extension portion extending from the main portion;
      a first spring in physical communication with the extension portion; and
      a first adjustable air baffle in physical communication with the extension portion, the first adjustable air baffle having a top section and a bottom section, the first spring extends from the bottom section to the extension portion through an inside of the top section, the first adjustable air baffle biased toward an extended position by the first spring, the first adjustable air baffle to transition from the extended position to a collapsed position in response to a force exerted on the first adjustable air baffle by a first memory module of the information handling system when the first memory module is located within the first memory slot of the information handling system while the main portion is in physical communication with the one or more cooling fans.

9. The information handling system of claim 8 further comprising:
   a second plurality of memory slots on a second side of the processor, the second plurality of memory slots including a second memory slot adjacent to and on the second side of the processor.

10. The information handling system of claim 9 further comprising:
a second adjustable air baffle in physical communication with the extension portion, the second adjustable air baffle is biased toward an extended position, the second adjustable air baffle to transition from the extended position to a collapsed position in response to a force exerted on the second adjustable air baffle by a second memory module of the information handling system when the second memory module is located within the second memory slot of the information handling system while the main portion is in physical communication with the one or more cooling fans.

11. The information handling system of claim 10 when the second adjustable air baffle is in the extended position and the main portion is in physical communication with the one or more cooling fans, the second adjustable air baffle prevents air flow from the one or more cooling fans from bypassing the processor on the second side of the processor.

12. The information handling system of claim 10 further comprising:
a second spring in physical communication with the second adjustable air baffle and the extension portion, the second spring is disposed between the second adjustable air baffle and the extension portion to bias the second adjustable air baffle toward the extended position.

13. The information handling system of claim 8 when the first adjustable air baffle is in the extended position and the main portion is in physical communication with the one or more cooling fans, the first adjustable air baffle prevents air flow from the one or more cooling fans from bypassing the processor on the first side of the processor.

14. The information handling system of claim 8 wherein the first adjustable air baffle extends from an enclosure of the extension portion.

15. An information handling system comprising:
a processor;
one or more cooling fans to provide air flow to the processor;
a first plurality of memory slots on a first side of the processor, the first plurality of memory slots including a first memory slot adjacent to and on the first side of the processor;
a second plurality of memory slots on a second side of the processor, the second plurality of memory slots including a second memory slot adjacent to and on the second side of the processor; and
an air shroud in physical communication with the one or more cooling fans, the air shroud including:
a main portion in physical communication with the one or more cooling fans of the information handling system;
an extension portion extending from the main portion;
a first adjustable air baffle in physical communication with the extension portion, the first adjustable air baffle biased toward an extended position, the first adjustable air baffle to transition from the extended position to a collapsed position in response to a force exerted on the first adjustable air baffle by a first memory module of the information handling system when the first memory module is located within the first memory slot of the information handling system while the main portion is in physical communication with the one or more cooling fans;
a first spring in physical communication with the first adjustable air baffle and the extension portion, the first spring disposed between the first adjustable air baffle and the extension portion to bias the first adjustable air baffle toward the extended position;
a second adjustable air baffle in physical communication with the extension portion, the second adjustable air baffle biased toward an extended position, the second adjustable air baffle to transition from the extended position to a collapsed position in response to a force exerted on the second adjustable air baffle by a second memory module of the information handling system when the second memory module is located within the second memory slot of the information handling system while the main portion is in physical communication with the one or more cooling fans; and
a second spring in physical communication with the second adjustable air baffle and the extension portion, the second spring disposed between the second adjustable air baffle and the extension portion to bias the second adjustable air baffle toward the extended position.

16. The information handling system of claim 15 when the second adjustable air baffle is in the extended position and the main portion is in physical communication with the one or more cooling fans, the second adjustable air baffle prevents the air flow from the one or more cooling fans from bypassing the processor on the second side of the processor.

17. The information handling system of claim 15 when the first adjustable air baffle is in the extended position and the main portion is in physical communication with the one or more cooling fans, the first adjustable air baffle prevents the air flow from the one or more cooling fans from bypassing the processor on the first side of the processor.

18. The information handling system of claim 15 wherein the first and second adjustable air baffles extend respectively from first and second enclosures of the extension portion.

* * * * *